(12) United States Patent
Jang et al.

(10) Patent No.: US 8,861,216 B2
(45) Date of Patent: Oct. 14, 2014

(54) FIXING MECHANISM AND RELATED ELECTRONIC DEVICE

(75) Inventors: Yung-Li Jang, New Taipei (TW); Jian-bing Shan, New Taipei (TW); Ming-Chih Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 212 days.

(21) Appl. No.: 13/545,997

(22) Filed: Jul. 11, 2012

(65) Prior Publication Data

US 2013/0107461 A1 May 2, 2013

(30) Foreign Application Priority Data

Nov. 2, 2011 (CN) .......................... 2011 1 0341107

(51) Int. Cl.
*H05K 7/00* (2006.01)
*G06F 1/18* (2006.01)
*H05K 7/20* (2006.01)
*H01L 23/40* (2006.01)
*G06F 1/20* (2006.01)

(52) U.S. Cl.
CPC .............. *H05K 7/2049* (2013.01); *G06F 1/203* (2013.01); *G06F 1/183* (2013.01); *H01L 23/40* (2013.01)
USPC ........... 361/760; 361/719; 361/728; 361/747; 361/752; 361/759; 174/260; 174/548; 174/561

(58) Field of Classification Search
USPC ....................... 361/676–678, 679.46–679.54, 361/688–722, 747, 752, 759–760, 831
See application file for complete search history.

(56) References Cited

U.S. PATENT DOCUMENTS

| | | | | |
|---|---|---|---|---|
| 5,552,961 | A | * | 9/1996 | Van Gaal et al. .............. 361/700 |
| 5,946,192 | A | * | 8/1999 | Ishigami et al. .............. 361/704 |
| 5,999,407 | A | * | 12/1999 | Meschter et al. .............. 361/704 |
| 6,151,215 | A | * | 11/2000 | Hoffman ....................... 361/704 |
| 6,717,799 | B2 | * | 4/2004 | Hamano et al. .......... 361/679.54 |
| 7,724,526 | B2 | * | 5/2010 | Hinze et al. ................... 361/704 |
| 2008/0253083 | A1 | * | 10/2008 | Okutsu ......................... 361/687 |

OTHER PUBLICATIONS

Office action mailed on May 6, 2014 for the Taiwan application No. 100140092, filing date: Nov. 3, 2011, p. 2 and p. 3 line 1-10.

* cited by examiner

*Primary Examiner* — Courtney Smith
(74) *Attorney, Agent, or Firm* — Winston Hsu; Scott Margo

(57) ABSTRACT

A fixing mechanism for fixing an electronic component is disclosed in the present invention. The fixing mechanism includes a first casing, a boss disposed on the first casing. The electronic component is disposed on the boss. The fixing mechanism further includes a resilient component disposed on the boss and located between the first casing and the electronic component, a circuit board putting on the electronic component and fixed on the first casing, and a second casing pressing the circuit board and fixed on the first casing. The circuit board contacts against the electronic component tightly by an assembly of the first casing and the second casing.

20 Claims, 6 Drawing Sheets

FIXING MECHANISM AND RELATED ELECTRONIC DEVICE

BACKGROUND OF THE INVENTION

1. Field of the Invention

The present invention relates to a fixing mechanism, and more particularly, to a fixing mechanism without screws and capable of effectively utilizing the disposition space and a related electronic device.

2. Description of the Prior Art

Generally, a thermal module of a notebook computer is fixed on a casing by a plurality of fixing components, such as screws. For contacting the thermal module against the heat source of the circuit board tightly, a fixing mechanism of the conventional notebook computer includes a circuit board whereon a plurality of holes is formed, and a plurality of bosses pierces through the corresponding hole. The fixing component pierces through the thermal module and is fixed inside the boss by a rotary engagement method or by a riveted joint method, so as to dispose the thermal module and the circuit board on the casing stably. However, the conventional fixing method is forming the holes on the circuit board, and setting the bosses inside the holes for an assembly of the fixing component. There is less mechanical disposition space inside the conventional notebook computer by the conventional fixing method. Therefore, design of a fixing mechanism without holes on the circuit board and capable of contacting the circuit board against the thermal module tightly is an important issue in the mechanical industry.

SUMMARY OF THE INVENTION

The present invention provides fixing mechanism without screws and capable of utilizing the disposition space and a related electronic device for solving above drawbacks.

According to the claimed invention, a fixing mechanism includes a first casing, a boss disposed on an inner surface of the first casing, and a resilient component disposed on the boss. An electronic component is disposed on the boss, and the resilient component is located between the first casing and the electronic component. The fixing mechanism further includes a circuit board put on the electronic component and fixed on the first casing, and a second casing pressing the circuit board and connected to the first casing. The circuit board contacts against the electronic component by an assembly of the first casing and the second casing.

According to the claimed invention, the fixing mechanism further includes a fixing component for fixing the second casing on the first casing.

According to the claimed invention, the electronic component is a thermal module for dissipating heat generated from a heat source of the circuit board.

According to the claimed invention, the resilient component generates a resilient recovering force to press the electronic component on the heat source of the circuit board.

According to the claimed invention, the boss is disposed on the inner surface of the first casing by a thermal melting method or by an injection molding method.

According to the claimed invention, the boss pierces through a hole on the electronic component to constrain a movement of the electronic component, and the boss does not pierce through the circuit board.

According to the claimed invention, an electronic device includes an electronic component, and a fixing mechanism for fixing the electronic component. The fixing mechanism includes a first casing, a boss disposed on an inner surface of the first casing, and a resilient component disposed on the boss. The electronic component is disposed on the boss, and the resilient component is located between the first casing and the electronic component. The fixing mechanism further includes a circuit board put on the electronic component and fixed on the first casing, and a second casing pressing the circuit board and connected to the first casing. The circuit board contacts against the electronic component by an assembly of the first casing and the second casing.

According to the claimed invention, a method of fixing an electronic component, the method includes disposing a boss on an inner surface of a first casing, disposing the electronic component on the boss, locating a resilient component between the electronic component and the first casing, disposing a circuit board on the electronic component and fixing the circuit board on the first casing, and pressing a second casing on the circuit board and connecting the second casing to the first casing, so that the circuit board contacts against the electronic component.

The fixing mechanism of the present invention does not utilize the screws to fix the electronic component on the casing, so as to economize manufacturing cost and working hours. In addition, the electronic device of the present invention does not form the hole on the circuit board for the screws, so that the circuit board of the present invention has more disposition space for circuit arrangement.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
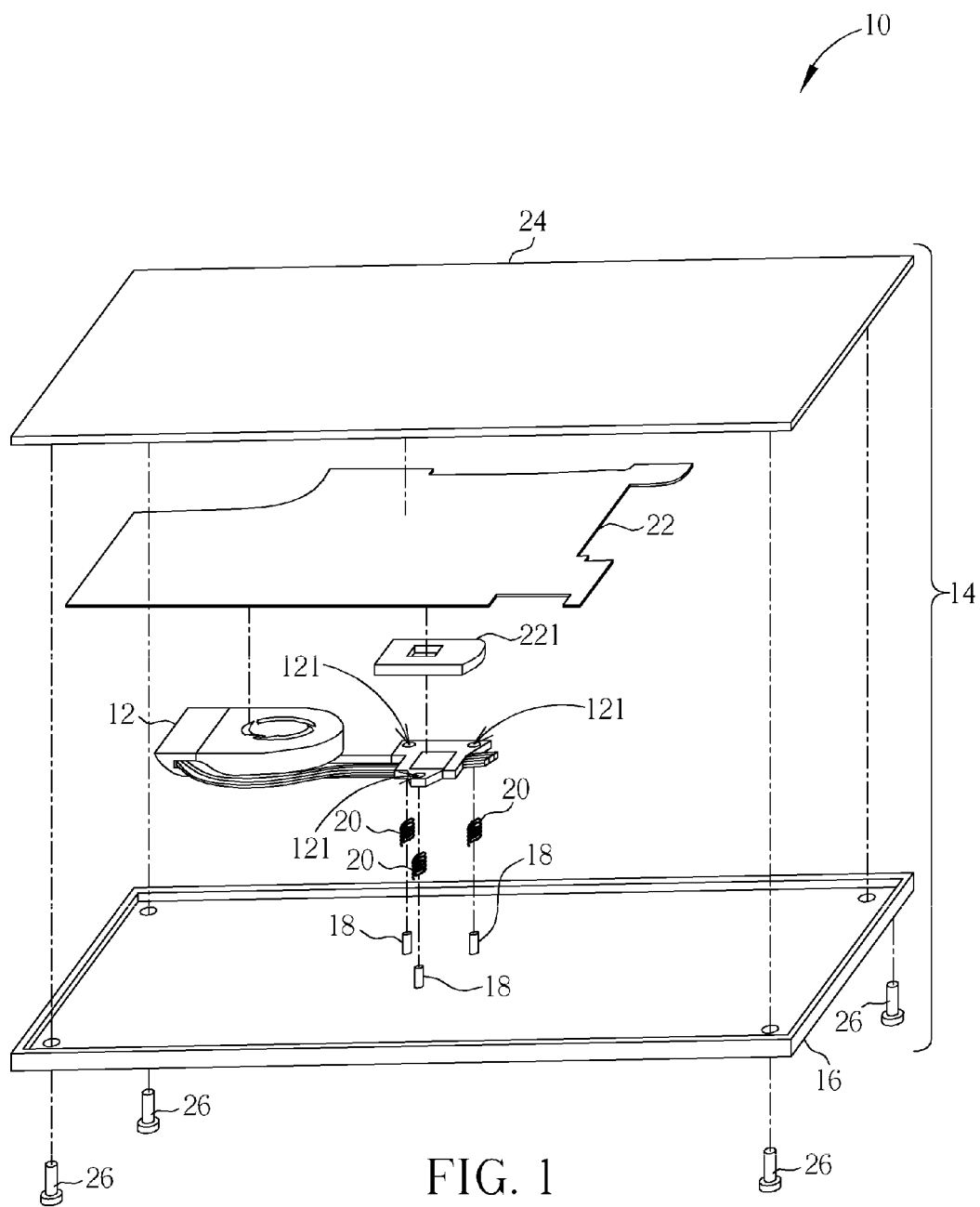
FIG. 1 is an exploded diagram of an electronic device according to an embodiment of the present invention.

Please refer to FIG. 1. FIG. 1 is an exploded diagram of an electronic device 10 according to an embodiment of the present invention. The electronic device 10 includes an electronic component 12 and a fixing mechanism 14. The fixing mechanism 14 can be used to fix the electronic component 12 for preventing separation. For example, the electronic device 10 can be a notebook computer, and the electronic component 12 can be a thermal module. The fixing mechanism 14 of the present invention can fix the thermal module without screws, so as to economize disposition space inside the electronic device 10.

Figure 2:
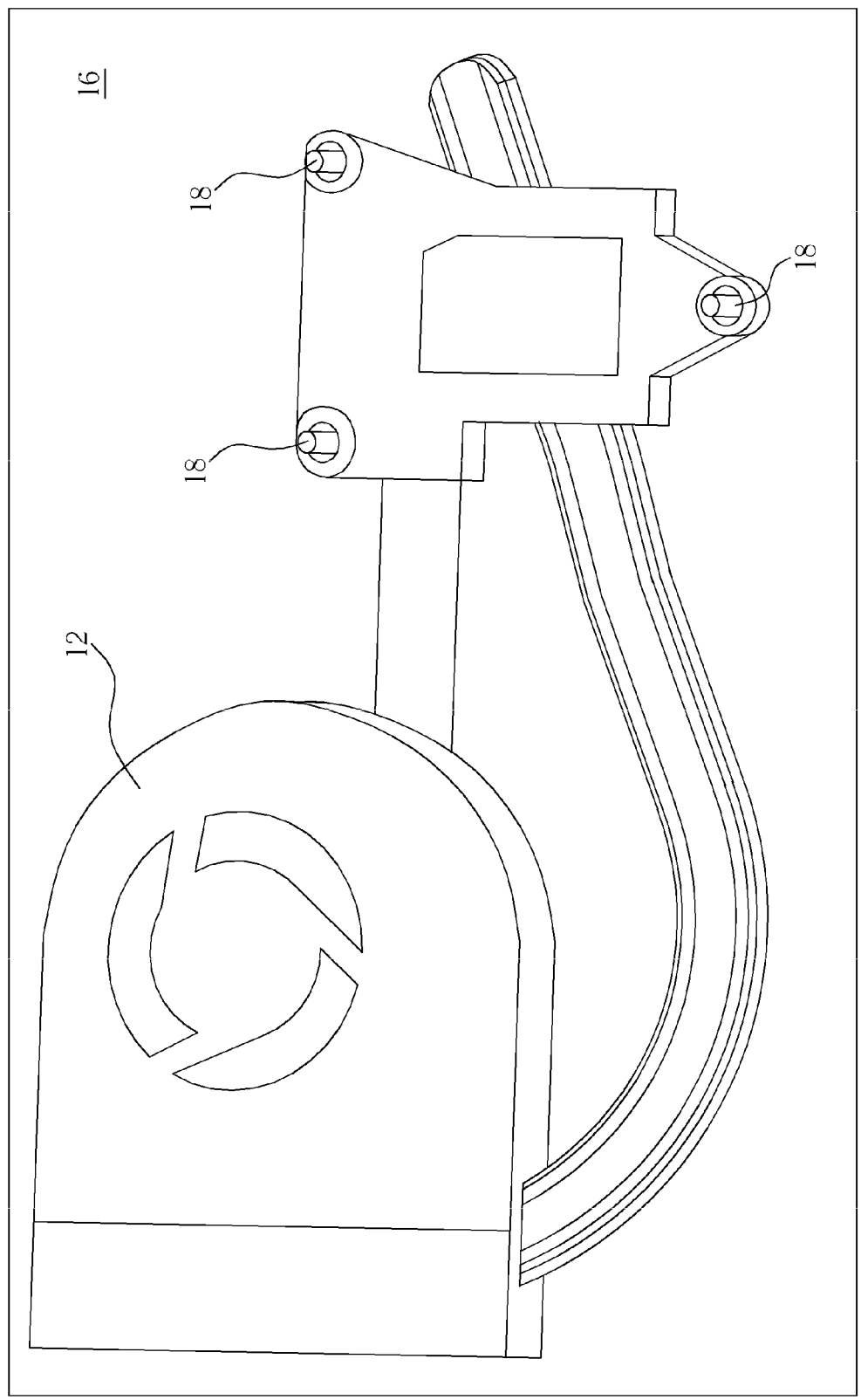
FIG. 2 is an assembly diagram of an electronic component and a first casing according to the embodiment of the present invention.
Figure 3:
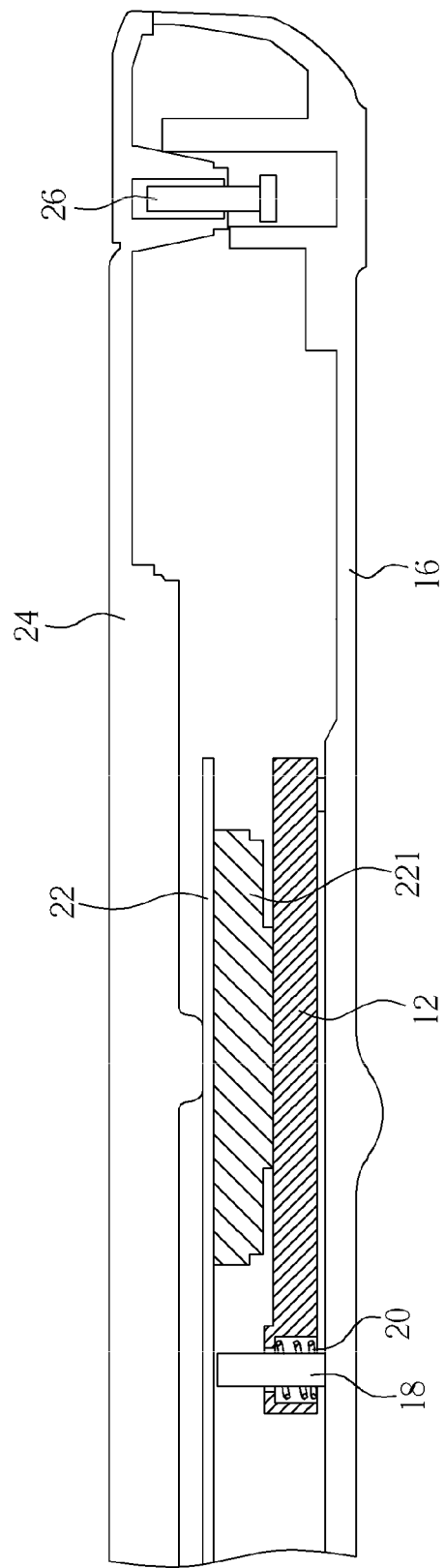
FIG. 3 is a sectional view of the assembly of the electronic component and the first casing according to the embodiment of the present invention.

The fixing mechanism 14 includes a first casing 16 and a plurality of bosses 18. Each boss 18 can be disposed on an inner surface of the first casing 16 by a thermal melting method or by an injection molding method. A plurality of holes 121 is formed on the structural surface of the electronic component 12, and the electronic component 12 can be disposed on the bosses 18 through the corresponding holes 121. The fixing mechanism 14 further includes a plurality of resilient components 20. The resilient components 20 are respectively disposed on the corresponding bosses 18 and located between the first casing 16 and the electronic component 12. Please refer to FIG. 2 and FIG. 3. FIG. 2 is an assembly diagram of the electronic component 12 and the first casing 16 according to the embodiment of the present invention. FIG. 3 is a sectional view of the assembly of the electronic component 12 and the first casing 16 according to the embodiment of the present invention. As shown in FIG. 2 and FIG. 3, the resilient component 20 can be a spring, and the spring sheathes on the boss 18.

Figure 4:
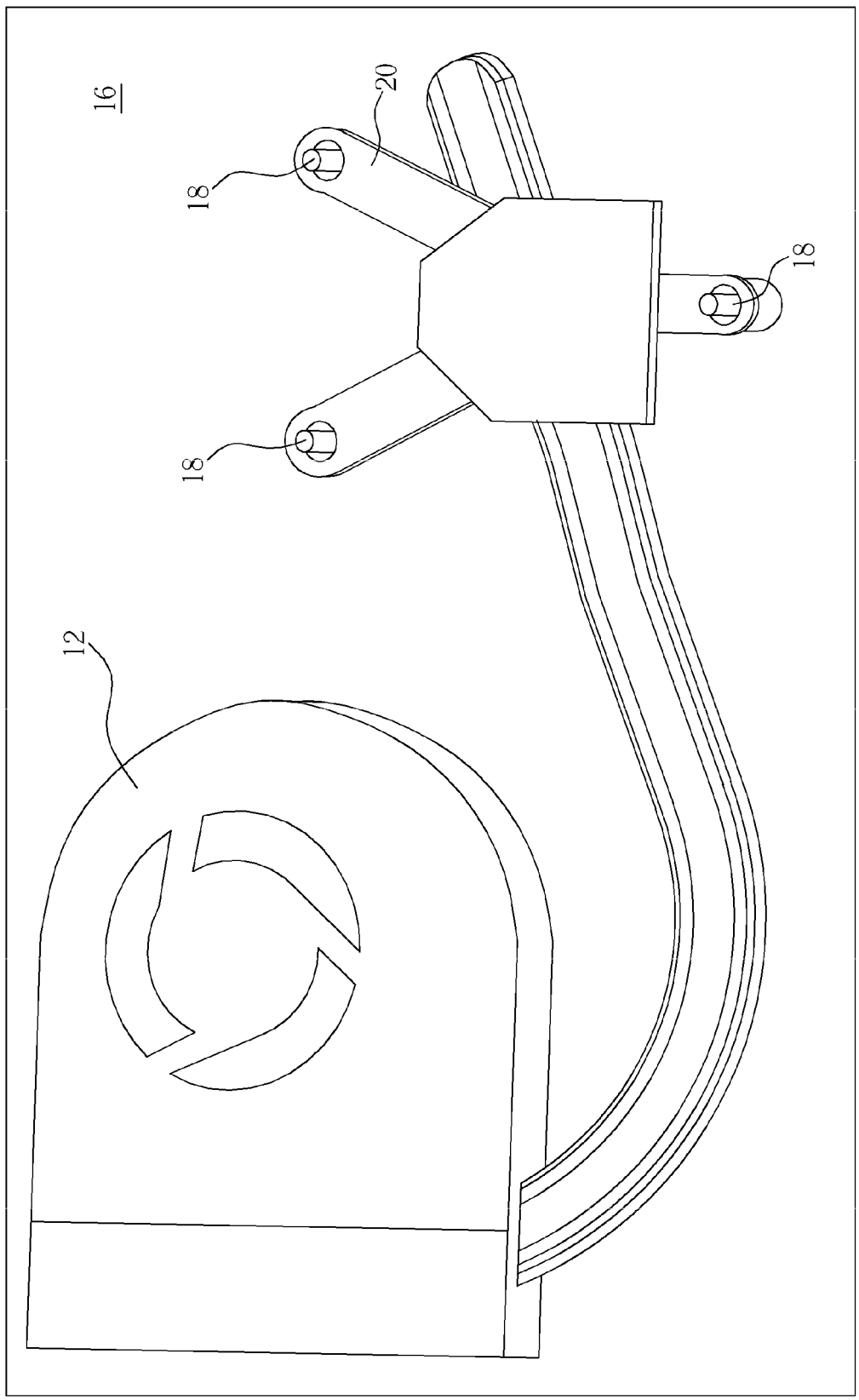
FIG. 4 is an assembly diagram of the electronic component and the first casing according to the other embodiment of the present invention.
Figure 5:
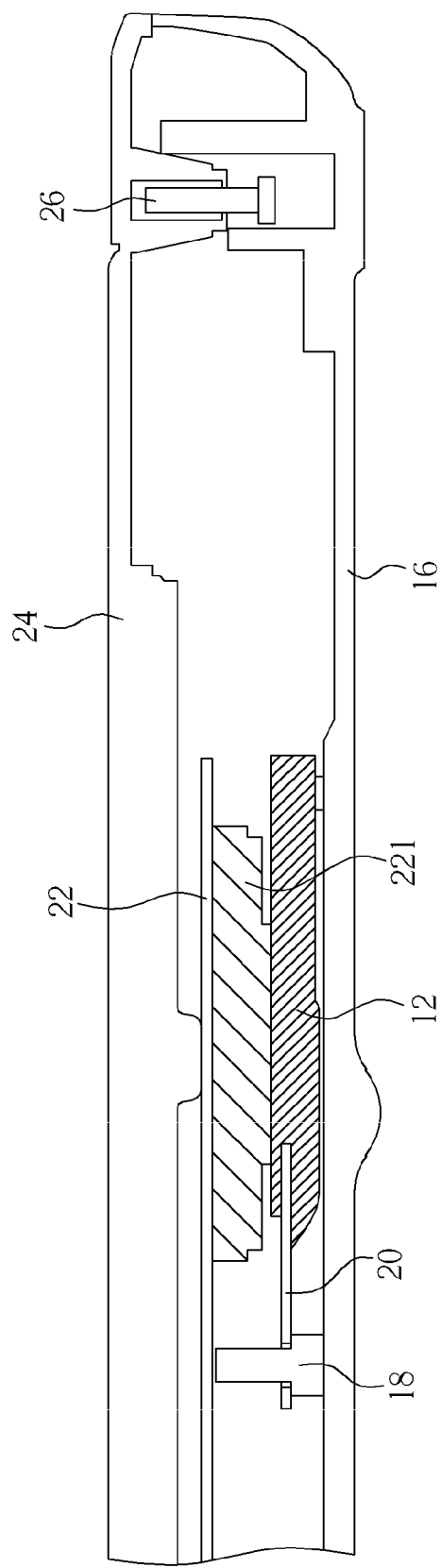
FIG. 5 is a sectional view of the assembly of the electronic component and the first casing according to the other embodiment of the present invention.

Please refer to FIG. 4 and FIG. 5. FIG. 4 is an assembly diagram of the electronic component 12 and the first casing 16 according to the other embodiment of the present invention. FIG. 5 is a sectional view of the assembly of the electronic component 12 and the first casing 16 according to the other embodiment of the present invention. As shown in FIG. 4 and FIG. 5, the resilient component 20 can further be an elastic piece connected to the electronic component 12 and sheathing on the boss 18. Therefore, the electronic component 12 can be disposed on the boss 18 in a loose fit manner, which means the electronic component 12 can slidably move relative to the boss 18. In addition, the resilient component 20 can absorb vibration generated from the electronic component 12, so as to prevent the vibration from transmitting toward the other inner electronic components, such as a hard disc or a CD-ROM drive.

The fixing mechanism 14 further includes a circuit board 22 put on the electronic component 12 and fixed on the first casing 16. The circuit board 22 can be different kinds of boards, such as a motherboard. The circuit board 22 can include a heat source 221, such as a central processing unit. The resilient component 20 can generate a resilient recovering force to press the electronic component 12 on the heat source 221 of the circuit board 22 tightly, so that the electronic component 12 (the thermal module) can effectively dissipate heat generate from the heat source 221 (the CPU) of the circuit board 22. Furthermore, the fixing mechanism 14 further includes a second casing 24 and a plurality of fixing components 26. The fixing component 26 can be a conventional fixing screw for fixing the second casing 24 on the first casing 16, so that the second casing 24 can press the circuit board 22 on the electronic component 12 inseparably.

It should be mentioned that the present invention utilizes stress generated by an assembly of the first casing 16 and the second casing 24 to fix the electronic component 12, so as to press the circuit board 22 close to the electronic component 12. Detail, the fixing mechanism 14 of the present invention can fix the second casing 24 on the first casing 16 via the fixing component 26, and the second casing 24 can press the circuit board 22 downward, as shown in FIG. 3 and FIG. 5. Because the electronic component 12 moves upward by the resilient recovering force of the resilient component 20, the heat source 221 of the circuit board 22 can press on the electronic component 12 inseparably, and the heat generated from the heat source 221 (the CPU) of the circuit board 22 can be effectively dissipated by the electronic component 12 (the thermal module). The boss 18 can be a supporter for the electronic component 12. The boss 18 does not pierce through the circuit board 22, and does not contact a surface of the circuit board 22, so that the circuit board 22 has more space on its surface to design the circuit arrangement.

Figure 6:
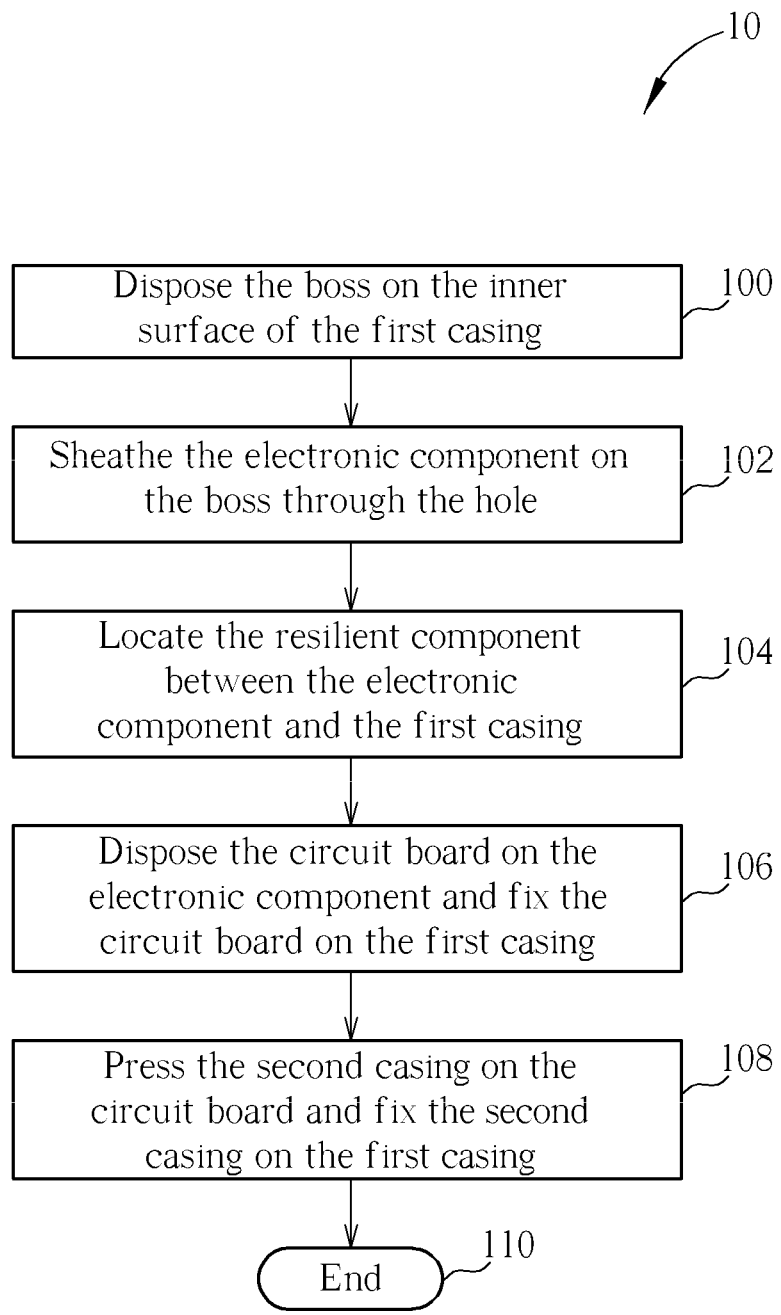
FIG. 6 is a flow chart of procedures of the electronic device according to the embodiment of the present invention.

Please refer to FIG. 6. FIG. 6 is a flow chart of procedures of the electronic device 10 according to the embodiment of the present invention. The method includes following:

Step 100: Dispose the boss 18 on the inner surface of the first casing 16.

Step 102: Dispose the electronic component 12 on the boss 18 through the hole 121 on the electronic component 12.

Step 104: Locate the resilient component 20 between the electronic component 12 and the first casing 16.

Step 106: Dispose the circuit board 22 on the electronic component 12, and fix the circuit board 22 on the first casing 16.

Step 108: Press the second casing 24 on the circuit board 22, and utilize the fixing component 26 to fix the second casing 24 on the first casing 16.

Step 110: End.

Detail description is introduced as following. First, the plurality of bosses 18 can be disposed on the inner surface of the first casing 16 by the thermal melting method or by the injection molding method. Because the boss 18 pierces through the hole 121 on the electronic component 12, an amount and a position of the boss 18 are set according to the amount and the position of the hole 121 on the electronic component 12. In the embodiment of the present invention, the fixing mechanism 14 includes three bosses 18 disposed on the inner surface of the first casing 16 as a triangular form. The electronic component 12 can include three holes 121 respectively for disposing on the corresponding boss 18.

The resilient component 20 can be designed as the spring or the elastic piece according to design demand. As shown in FIG. 2 and FIG. 3, the resilient component 20 can sheathe on the boss 18 when the resilient component 20 is the spring, and the electronic component 12 can be disposed on the boss 18 through the hole 121, so that the electronic component 12 is supported by the spring and disposed on the boss 18 in the loose fit manner. Furthermore, as shown in FIG. 4 and FIG. 5, the resilient component 20 can be connected to a side of the electronic component 12 when the resilient component 20 is the elastic piece (or the elastic piece can be integrated with the electronic component 12 monolithically). The hole 121 can be formed on the elastic piece, and the electronic component 12 can be disposed on the boss 18 through the hole 121, then finish the procedures of step 100 to step 104.

After disposing the circuit board 12 on the boss 18, the circuit board 22 can be put above the electronic component 12, and the circuit board 22 can be fixed on the first casing 16. A height of the boss 18 is substantially smaller than a distance between the circuit board 22 and the first casing 16 (as the circuit board 22 is fixed on the first casing 16), which means a top of the boss 18 does not contact the circuit board 22 when the user utilizes the screws to lock the circuit board 22 at the first casing 16, as shown in FIG. 3 and FIG. 5, so the circuit board 22 has more disposition space on its surface. The heat source 221 can be disposed on a side of the circuit board 22 adjacent to the electronic component 12. The heat source 221 presses the electronic component 12 downward when the circuit board 22 is disposed on the first casing 16, so as to drive the resilient component, which is disposed under the electronic component 12, to generate resilient deformation. Meanwhile, the resilient component 20 can utilize the resilient recovering force to press the electronic component 12 on the heat source 221 inseparably.

The resilient component 20 not only can generate the resilient recovering force, but also can be a vibration absorber. For example, the resilient component 20 can absorb the vibration when the vibration generated from the electronic component 12 (such as a fan of the thermal module) during operation, so the electronic component 12 can be a suspender located between the circuit board 22 and the first casing 16 along the boss 18, which means that the electronic component 12 does not contact the first casing 16, to prevent the vibration from transmitting to the other inner electronic components through the first casing 16. Final, the second casing 24 can press on the circuit board 22, and be fixed on the first casing 16 by the fixing components 26, such as the screws. Therefore the fixing mechanism 14 of the present invention can utilize the stress generated by the assembly of the first casing 16, the second casing 24 and the fixing components 26 to increase rigidly precision between the circuit board 22 and the electronic component 12.

In conclusion, the fixing mechanism of the present invention can dispose the electronic component (the thermal module) on the boss disposed on the inner surface of the first casing in the loose fit manner. The resilient component can be located between the electronic component and the first casing. For example, the resilient component can be the spring. The spring can sheathe on the boss, and the electronic component can be disposed on the boss through the hole and press on the spring. In addition, the resilient component can be the elastic piece connected to the electronic component. The electronic component can be disposed on the boss through the hole on the elastic piece, so that the resilient component (the spring or the elastic piece) can absorb the vibration generated from the electronic component. The second casing and the circuit board can be respectively fixed on the first casing. The resilient component can press the electronic component (the thermal module) on the heat source of the circuit board inseparably, so the electronic device of the present invention has preferred heat dissipating efficiency.

Comparing to the prior art, the fixing mechanism of the present invention does not utilize the screws to fix the electronic component on the casing, so as to economize manufacturing cost and working hours. In addition, the electronic device of the present invention does not form the hole on the circuit board for the screws, so that the circuit board of the present invention has more disposition space for circuit arrangement.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism comprising:
a first casing;
a boss disposed on an inner surface of the first casing, an electronic component being disposed on the boss;
a resilient component disposed on the boss and located between the first casing and the electronic component;
a circuit board put on an upper surface of the electronic component and fixed on the first casing, the resilient component pressing the electronic component to contact the circuit board; and
a second casing pressing the circuit board and connected to the first casing, the circuit board contacting against the electronic component by an assembly of the first casing and the second casing.

2. The fixing mechanism of claim 1, further comprising:
a fixing component for fixing the second casing on the first casing.

3. The fixing mechanism of claim 1, wherein the electronic component is a thermal module for dissipating heat generated from a heat source of the circuit board.

4. The fixing mechanism of claim 3, wherein the resilient component generates a resilient recovering force to press the electronic component on the heat source of the circuit board.

5. The fixing mechanism of claim 1, wherein the boss is disposed on the inner surface of the first casing by a thermal melting method or by an injection molding method.

6. The fixing mechanism of claim 1, wherein the boss pierces through a hole on the electronic component to constrain a movement of the electronic component, and the boss does not pierce through the circuit board.

7. An electronic device comprising:
an electronic component; and
a fixing mechanism for fixing the electronic component, the fixing mechanism comprising:
a first casing;
a boss disposed on an inner surface of the first casing, the electronic component being disposed on the boss;
a resilient component disposed on the boss and located between the first casing and the electronic component;
a circuit board put on an upper surface of the electronic component and fixed on the first casing, the resilient component pressing the electronic component to contact the circuit board; and
a second casing pressing the circuit board and connected to the first casing, the second casing covering the electronic component with the first casing, and the circuit board contacting against the electronic component by an assembly of the first casing and the second casing.

8. The electronic device of claim 7, wherein the fixing mechanism further comprises:
a fixing component for fixing the second casing on the first casing.

9. The electronic device of claim 7, wherein the electronic component is a thermal module for dissipating heat generated from a heat source of the circuit board.

10. The electronic device of claim 9, wherein the resilient component generates a resilient recovering force to press the electronic component on the heat source of the circuit board.

11. The electronic device of claim 7, wherein the boss is disposed on the inner surface of the first casing by a thermal melting method or by an injection molding method.

12. The electronic device of claim 7, wherein the boss pierces through a hole on the electronic component to constrain a movement of the electronic component, and the boss does not pierce through the circuit board.

13. The electronic device of claim 7, wherein the electronic component is disposed on the boss in a loose fit manner.

14. A method of fixing an electronic component, the method comprising:
disposing a boss on an inner surface of a first casing;
disposing the electronic component on the boss;
locating a resilient component between the electronic component and the first casing;
disposing a circuit board on an upper surface of the electronic component and fixing the circuit board on the first casing, wherein the resilient component presses the electronic component to contact the circuit board; and
pressing a second casing on the circuit board and connecting the second casing to the first casing so that the circuit board contacts against the electronic component.

15. The method of claim 14, wherein connecting the second casing to the first casing comprises:
utilizing a fixing component to fix the second casing on the first casing.

16. The method of claim 14, wherein the electronic component is a thermal module for dissipating heat generated from a heat source of the circuit board.

17. The method of claim 16, wherein the resilient component utilizes a resilient recovering force to press the electronic component on the heat source of the circuit board when the circuit board is put on the electronic component.

18. The method of claim 14, wherein disposing the boss on the inner surface of the first casing comprises:
 disposing the boss on the inner surface of the first casing by a thermal melting method or by an injection molding method.

19. The method of claim 14, wherein the boss pierces through a hole on the electronic component to constrain a movement of the circuit board when the circuit board is put on the circuit board, and the boss dose not pierce through the circuit board.

20. The method of claim 14, wherein the electronic component is disposed on the boss in a loose fit manner.

* * * * *